US012805009B2

(12) United States Patent
Ho et al.

(10) Patent No.: US 12,805,009 B2
(45) Date of Patent: Nov. 17, 2026

(54) ANTI-DOPED MOS DEVICE AND VOLTAGE REFERENCE CIRCUIT INCLUDING SAME

(71) Applicant: Taiwan Semiconductor Manufacturing Company LTD

(72) Inventors: Chia-Cheng Ho, Hsinchu (TW); Chia-Yu Wei, Hsinchu (TW); Po-Yu Chiang, Hsinchu (TW); Victor Chiang Liang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 441 days.

(21) Appl. No.: 18/468,498

(22) Filed: Sep. 15, 2023

(65) Prior Publication Data

US 2025/0098294 A1 Mar. 20, 2025

(51) Int. Cl.

| | |
|---|---|
| ***H10D 84/85*** | (2025.01) |
| ***H10D 62/13*** | (2025.01) |
| ***H10D 62/822*** | (2025.01) |
| ***H10D 64/23*** | (2025.01) |
| ***H10D 64/27*** | (2025.01) |
| ***H10D 84/01*** | (2026.01) |
| ***H10D 84/03*** | (2025.01) |

(52) U.S. Cl.

CPC ......... *H10D 84/856* (2025.01); *H10D 62/153* (2025.01); *H10D 62/157* (2025.01); *H10D 62/822* (2025.01); *H10D 64/256* (2025.01); *H10D 64/516* (2025.01); *H10D 84/017* (2025.01); *H10D 84/038* (2025.01)

(58) Field of Classification Search

CPC ............... H10D 84/856; H10D 62/153; H10D 62/157; H10D 62/822; H10D 64/256; H10D 64/516; H10D 84/017; H10D 84/038

See application file for complete search history.

(56) References Cited

U.S. PATENT DOCUMENTS

2006/0148148 A1* 7/2006 Kim .................. H10D 84/0174 438/185
2023/0197725 A1* 6/2023 Weng ................ H10D 84/0177

OTHER PUBLICATIONS

May et al., "Threshold Voltage Adjustment on 4H—SiC MOSFETs Using p-Doped Polysilicon as a Gate Material", Key Engineering Materials, ISSN: 1662-9795, vol. 947, pp. 57-62, Published online May 31, 2023 (Year: 2023).*

* cited by examiner

*Primary Examiner* — Jay C Kim
*Assistant Examiner* — Woo K Lee
(74) *Attorney, Agent, or Firm* — Lippes Mathias LLP

(57) ABSTRACT

In a method of fabricating an electronic device, a first nMOS device structure and a second nMOS device structure are formed. Each nMOS device structure includes a gate oxide disposed on a p-type base material and a gate disposed on the gate oxide. N-type dopant implantation is performed to form source and drain regions in the p-type substate of the first nMOS device structure and source and drain regions in the p-type substate of the second nMOS device structure, and to further dope the gate of the first nMOS device structure n-type to form a first nMOS device with the gate doped n-type. P-type dopant implantation is performed to dope the gate of the second nMOS device structure p-type to form the second nMOS device structure with the gate anti-doped p-type.

20 Claims, 9 Drawing Sheets nMOS AND Anti-doped nMOS nMOS AND Anti-doped nMOS nMOS AND Anti-doped nMOS nMOS AND Anti-doped nMOS

ANTI-DOPED MOS DEVICE AND VOLTAGE REFERENCE CIRCUIT INCLUDING SAME

BACKGROUND

The following relates to the complementary metal-oxide-semiconductor (CMOS) integrated circuit (IC) device arts, CMOS IC fabrication arts, voltage reference circuit arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
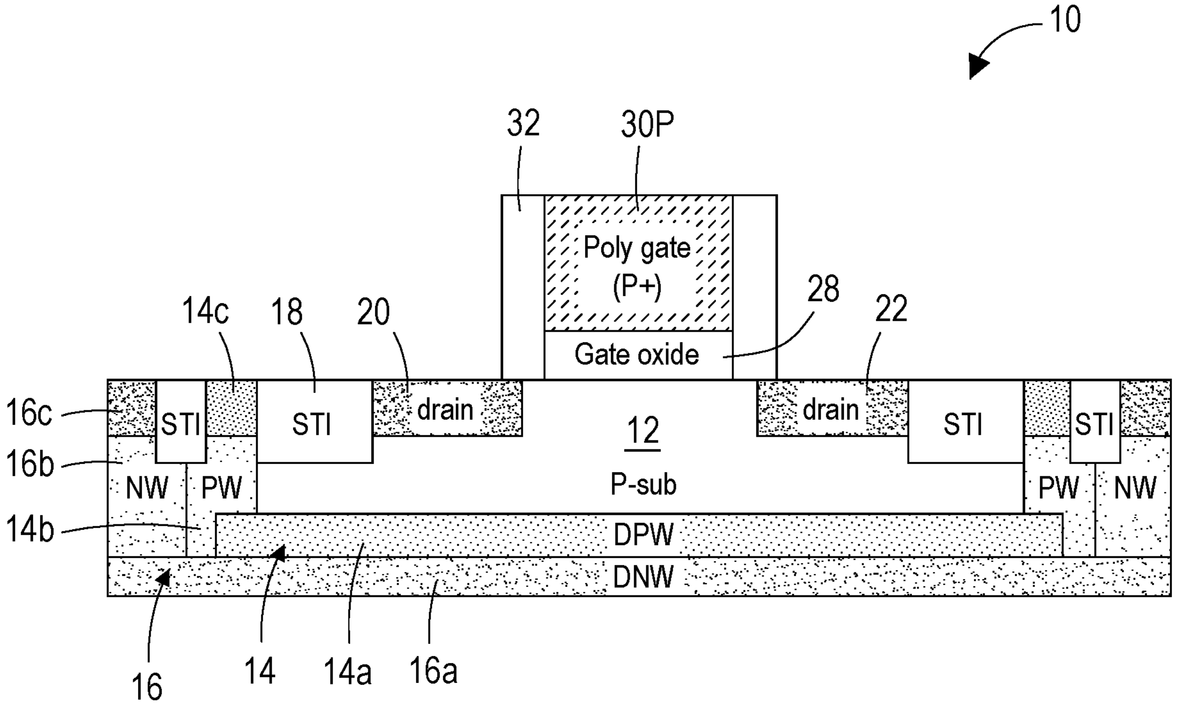
FIG. 1 illustrates a sectional view of an anti-doped nMOS transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Voltage reference circuits generate a reference voltage that can be used for various purposes, such as serving as a threshold voltage for determining whether a binary value in a digital circuit is a logical "1" or a logical "0". The semiconductor bandgap can serve as the basis for such a voltage reference. To this end, a quantifiable value related to the bandgap, such as a junction voltage of a bipolar junction transistor (BJT) or the gate-to-source voltage ($V_{GS}$) of a MOSFET, can be used as the reference voltage. However, the bandgap is dependent on temperature, and hence the temperature variability must be accounted for to provide a high precision voltage reference. Moreover, accessible BJT or MOSFET voltages such as the MOSFET $V_{GS}$ depend on numerous geometrical and material-based parameters of the BJT or MOSFET device. To compensate for these factors and obtain a high precision voltage reference, the circuit typically includes two MOSFETs (denoted here without loss of generality as MOS M1 and MOS M2) that differ in some a priori-known way and are interconnected to output a difference value such as a difference in Vas, for example expressed as $\Delta V_{GS}=(V_{GS,1}-V_{GS,2})$ where $V_{GS,1}$ is the gate-to-source voltage of the first MOSFET M1 and $V_{GS,2}$ is the gate-to-source voltage of the second MOSFET M2. The two MOSFET devices M1 and M2 must differ in some way so that $\Delta V_{GS}$ is nonzero. With suitable design, temperature and/or various other confounding factors can cancel out in the measured voltage difference $\Delta V_{GS}$. In some such designs, one MOSFET (e.g., M1) may comprise a set of two or more constituent MOSFET devices to provide the desired difference compared with MOSFET M2 to provide the desired measured nonzero $\Delta V_{GS}$.

It is often desired to limit the power consumed by the voltage reference, and/or to minimize its area. To this end, a MOSFET-based voltage reference may be preferable over a BJT-based voltage reference, due to the smaller MOSFET device area and its lower power consumption. Moreover, the approach of employing multiple constituent MOSFETs for (e.g.) M1 is disadvantageous both in terms of power consumption and area. If there are vertical design constraints such as when fabricating on a relatively thin silicon layer of a silicon-on-insulator (SOI) wafer, lateral MOSFET devices can again be preferable over vertical BJT devices. Motivated by the foregoing, some illustrative voltage reference circuit designs disclosed herein are implemented using MOSFETs with temperature-compensated $\Delta V_{GS}$ as the basis for the output voltage reference.

When employing such a MOSFET-based voltage reference, as noted above the two MOSFETs (e.g., M1 and M2) should be different in a manner that enables temperature (and possibly other confounding factors) to cancel out (or at least be able to be accounted for) in the $\Delta V_{GS}$ value that serves as the basis for the output voltage reference. One approach is to employ two MOSFETs of different polarity, e.g. one being an nMOS and the other a pMOS. The nMOS device can be thought of as a native nMOS device if the integrated circuit (IC) is being fabricated in nMOS technology using nMOS devices for the transistors of the IC. However, fabrication of the "non-native" MOSFET significantly complicates fabrication workflow. For example, if the integrated circuit (IC) of which the voltage reference (sub-) circuit is a part is an nMOS-based IC, then fabricating the opposite-polarity pMOS for the voltage reference complicates the fabrication workflow and can introduce other difficulties. As an example, the voltage reference could employ substrate PNP. Although substrate PNP is common in CMOS technology, voltage references built with it have limited accuracy and occupy large area.

Another way to obtain two different MOSFETs M1 and M2 is to employ a flipped-gate nMOS as (e.g.) M1, and a conventional nMOS as M2. The flipped-gate nMOS has its gate doped in an n/p/n structure. This approach exploits the polysilicon work function difference between the n-type gate of the conventional nMOS and the n/p/n gate of the flipped-gate nMOS devices. Voltage reference circuits employing a flipped-gate nMOS device in combination with a native nMOS device provides compactness and low power consumption. However, fabrication of the flipped-gate nMOS device with its n/p/n gate doping increases complexity of the IC workflow. Additionally, the flipped-gate nMOS device is not well matched with the native nMOS counterpart.

In embodiments disclosed herein, an anti-doped nMOS device is disclosed, which is intrinsically matched with the native nMOS device. This intrinsic matching of the anti-doped nMOS device and the native nMOS device provides high temperature stability for the output reference voltage, and suppresses substrate noise. Furthermore, in embodiments disclosed herein the voltage reference can be fabricated in the usual CMOS fabrication workflow with only minor adjustment such as modifying photolithography masks to provide the anti-doping of the gate of the anti-doped nMOS device.

In the examples herein, the voltage reference circuit is part of a CMOS fabrication workflow in which the native MOSFET is nMOS. However, it will be appreciated that the voltage circuit could alternatively be part of a CMOS fabrication workflow in which the native MOSFET is pMOS, merely by reversing the doping types throughout. Moreover, while the disclosed anti-doped nMOS device embodiments are illustratively disclosed as incorporated into a voltage reference circuit, they are contemplated to be employed in other types of circuits which can utilize the output $\Delta V_{GS}$, such as a temperature sensor circuit as another nonlimiting illustrative example.

With reference to FIG. 1, an illustrative embodiment of an anti-doped nMOS device 10 is shown, which is fabricated in p-type base material 12. The p-type base material 12 is sometimes referred to herein as a p-type substrate-however, the p-type base material could more generally be of another form, such as a layer of p-type material epitaxially grown on a silicon substrate, or a silicon layer of a silicon-on-insulator (SOI) wafer, as further nonlimiting illustrative examples. In the illustrative embodiments described herein the p-type base material 12 is p-type silicon material; however, other types of semiconductor material are contemplated as the silicon base material 12, such as p-type silicon-germanium material (i.e., $Si_{1-x}Ge_x$ where $0<x<1$). The p-type base material 12 is contained in a well structure. The illustrative well structure is a double-well including an inner p-type well 14 that contains the p-type base material 12, and an n-type well 16 that contains the p-type well 14. In this design, the p-type well 14 has higher p-type doping than the p-type base material 12. In the illustrative examples the p-type well 14 and n-type well 16 are formed by dopant implantation into the p-type base material 12—however, other approaches are contemplated such as etching a cavity and depositing the well on the bottom and sidewalls of the cavity followed by filling the remainder of the cavity with the p-type base material. For the illustrative embodiment of FIG. 1, the p-type well 14 is formed as three parts implemented by three implantation steps: a p-well bottom portion 14*a* and *p*-well sidewalls 14*b* and 14*c*. Similarly, the n-type well 16 is formed as three parts implemented by three implantation steps: an n-well bottom portion 16*a* and *n*-well sidewalls 16*b* and 16*c*. The p-type well 14 and n-type well 16 may in some nonlimiting illustrative embodiments have a depth of around 2-10 microns. The p-type well bottom portion 14*a* may in some nonlimiting illustrative embodiments have a thicknesses of around 0.1 micron to 2 micron, and a p-type doping concentration of about $10^{16}$-$10^{18}$ $cm^{-3}$. The n-type well bottom portion 16*a* may in some nonlimiting illustrative embodiments have a thicknesses of around 0.1 micron to 1 micron, and an n-type doping concentration of about $10^{16}$-$10^{19}$ $cm^{-3}$.

The illustrative anti-doped nMOS device 10 further includes isolation regions 18, which in the illustrative example are shallow trench isolation (STI) regions, although other types of isolation such as local oxidation of silicon (LOCOS) are contemplated. The deep p-well (DPW) 14/deep n-well (DNW) 16 well structure along with the isolation regions 18 serve to electrically isolate the nMOS 10 from neighboring electronic devices formed in the p-type base semiconductor material.

With continuing reference to FIG. 1, the illustrative anti-doped nMOS device 10 includes a drain region 20 and a source region 22 spaced apart by a gate structure comprising a gate oxide 28 and a p-type gate 30P. The illustrative gate structure further includes spacers 32, although these are optional. Notably, the entire p-type gate 30P is doped p-type—it includes no n-type regions. In a native nMOS device, the gate is doped n-type; hence, the p-type gate 30P may also be referred to herein as an anti-doped gate 30P.

The source and drain regions 20 and 22 are suitably formed by dopant diffusion or dopant implantation into the p-type base material 12, and may in some nonlimiting illustrative examples have thicknesses of 0.1 nm to 500 nm and an n-type doping concentration in a range of $10^{18}$-$10^{21}$ $cm^{-3}$.

The gate oxide 28 is made of a suitable oxide material such as silicon dioxide ($SiO_2$) or a high-k oxide such as hafnium oxide ($HfO_2$), zirconium oxide ($ZrO_2$), hafnium zirconium oxide ($HfZrO_2$), a mixed $HfO_2$+$SiO_2$, or so forth. The gate oxide 28 may suitably have a typical thickness for a MOSFET device, e.g. around 1 nm to 20 nm thick in some nonlimiting illustrative examples.

The p-type gate 30P is made of a suitable electrically conductive material such as polysilicon or a metal such as titanium nitride (TiN) or tantalum nitride (TaN). In nonlimiting illustrative examples herein, the p-type gate 30 is polysilicon. In some nonlimiting illustrative examples, the p-type gate 30P may have a thickness in a range of 50 nm to 500 nm.

Figure 2A:
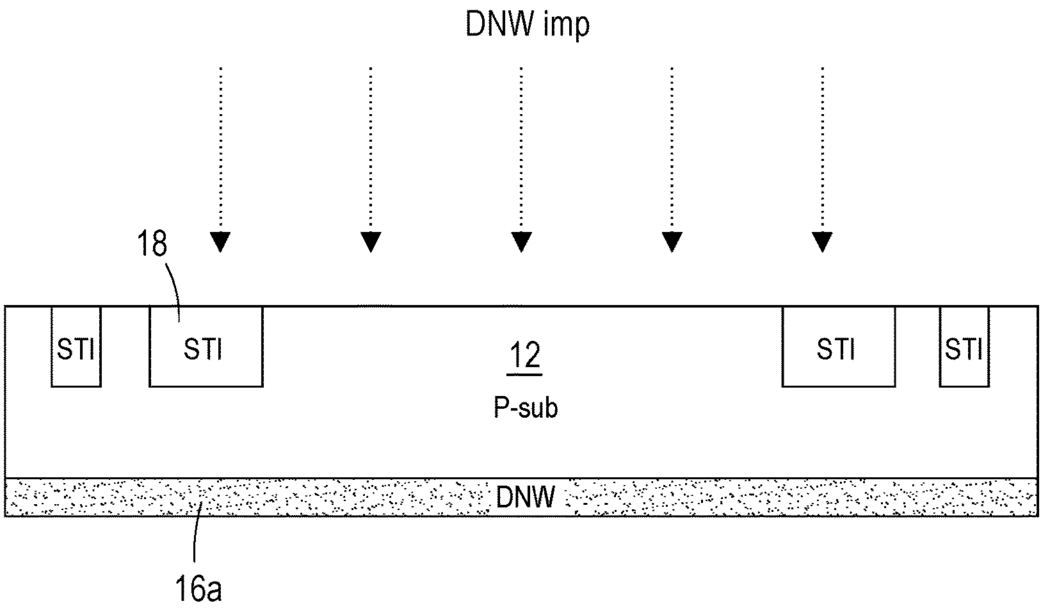
FIGS. 2A, 2B, 2C, 2D, 2E, and 2F illustrate sectional views of successive stages of fabrication of either an nMOS transistor or an anti-doped nMOS transistor such as that of FIG. 1.
Figure 2B:
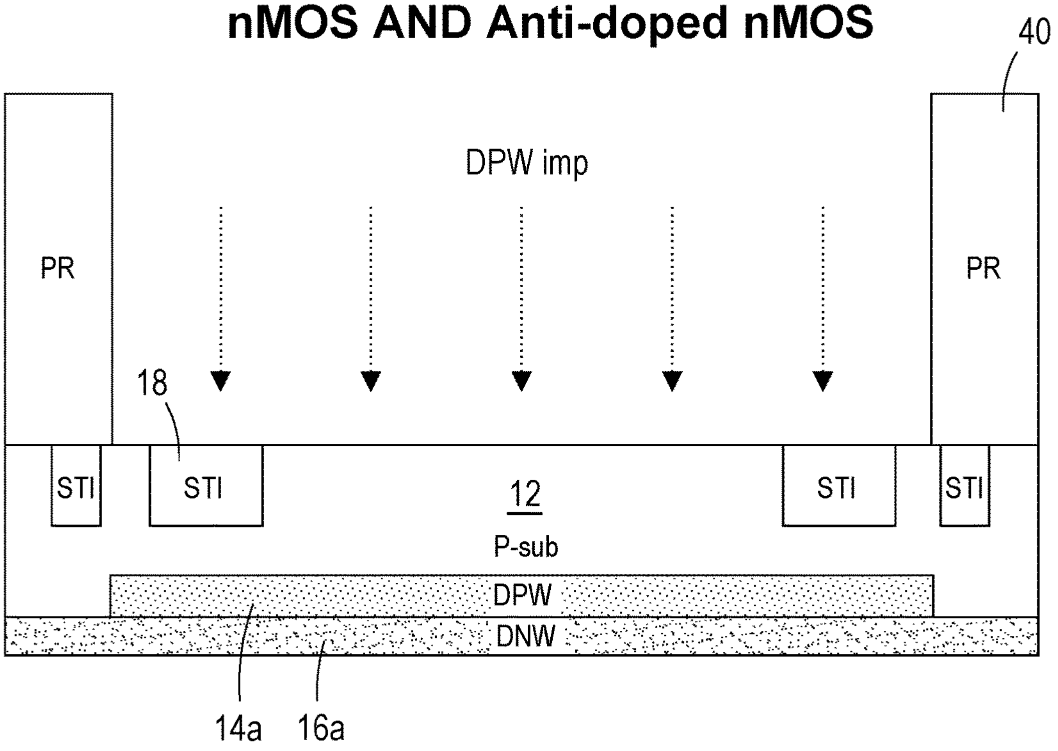
Figure 2C:
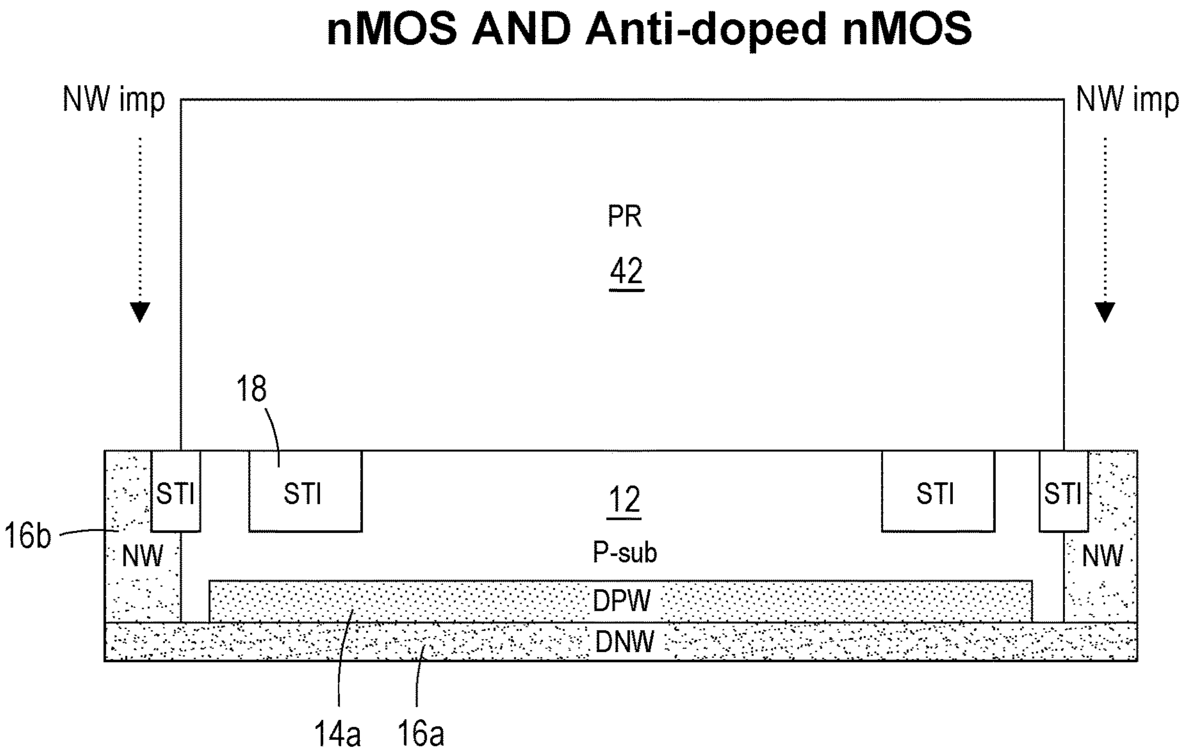
Figure 2D:
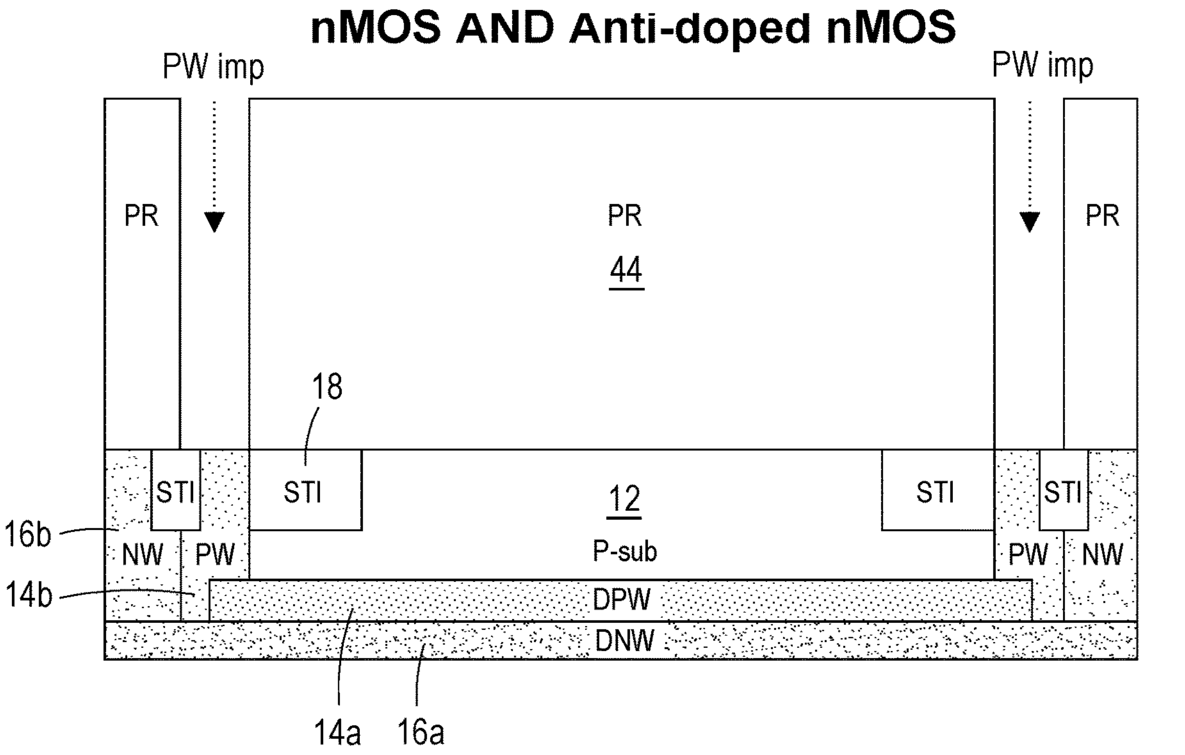
Figure 2E:
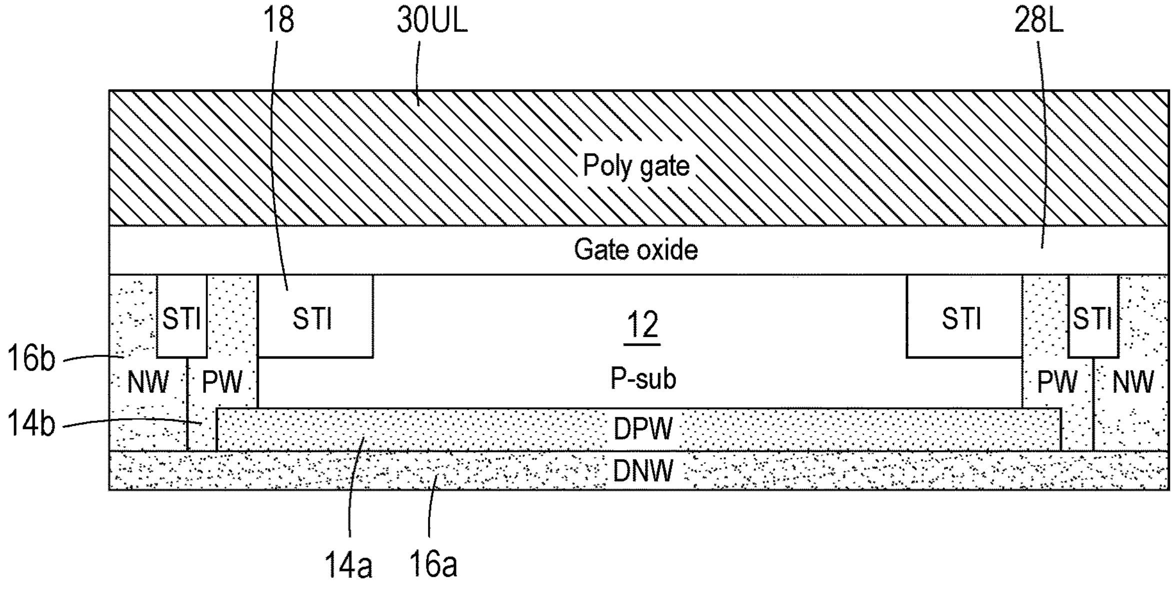
Figure 2F:
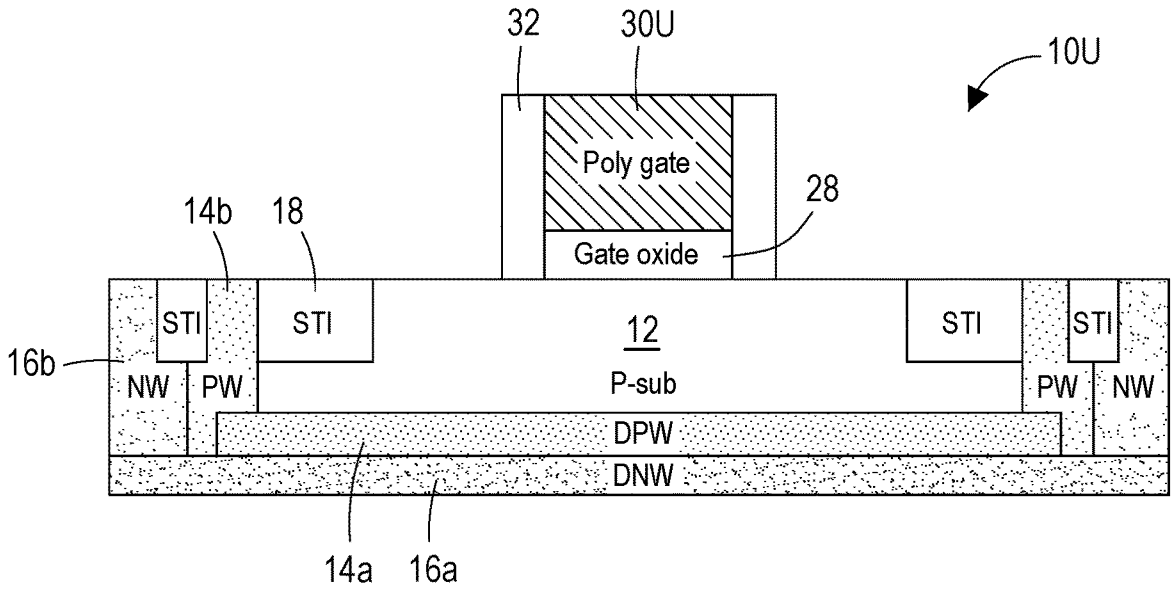
Figure 2G:
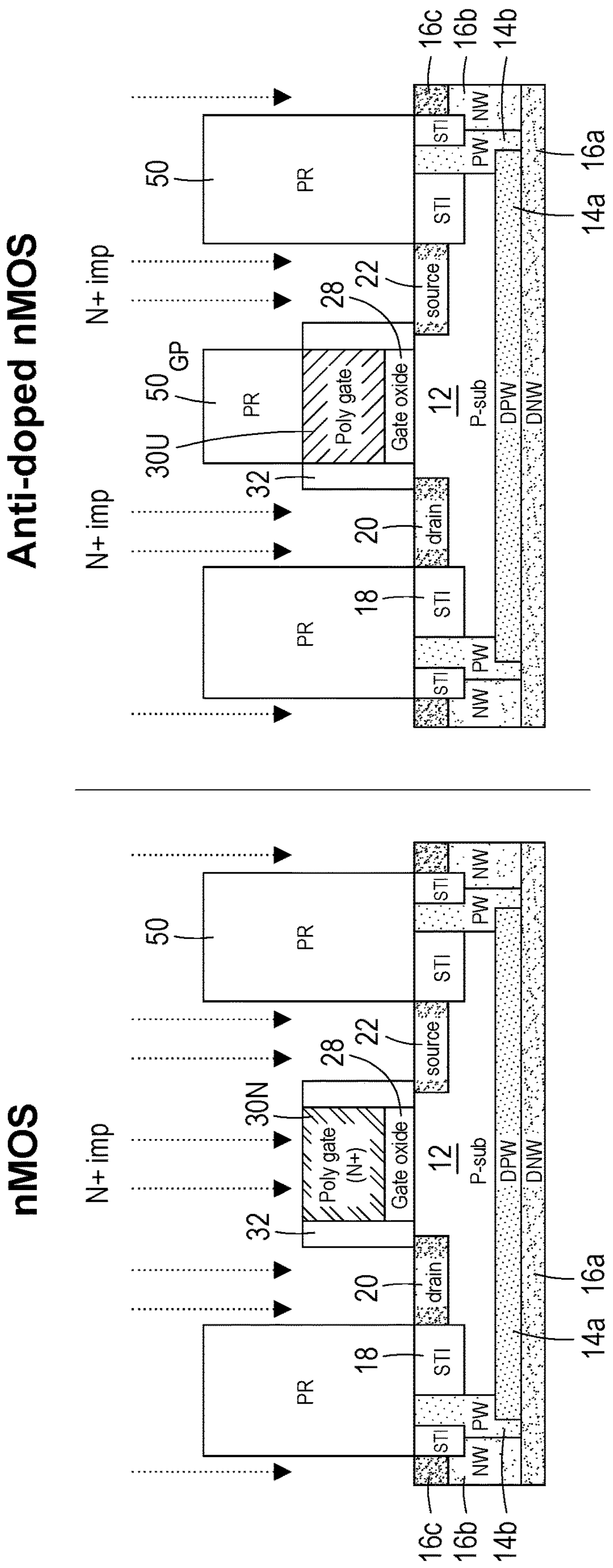
FIGS. 2G and 2H illustrate sectional views of further successive stages of fabrication (after the stage shown in FIG. 2F) of an nMOS transistor (left side) and an anti-doped nMOS transistor such as that of FIG. 1 (right side).
Figure 2H:
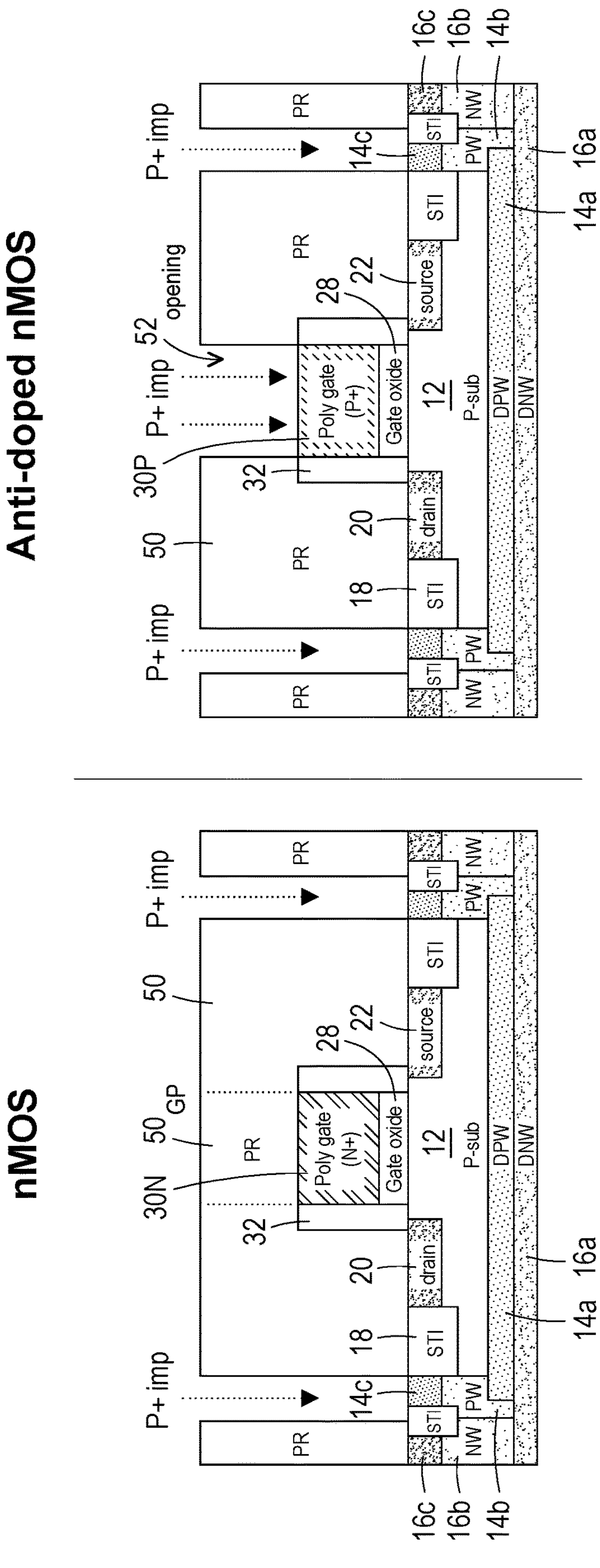
Figure 2I:
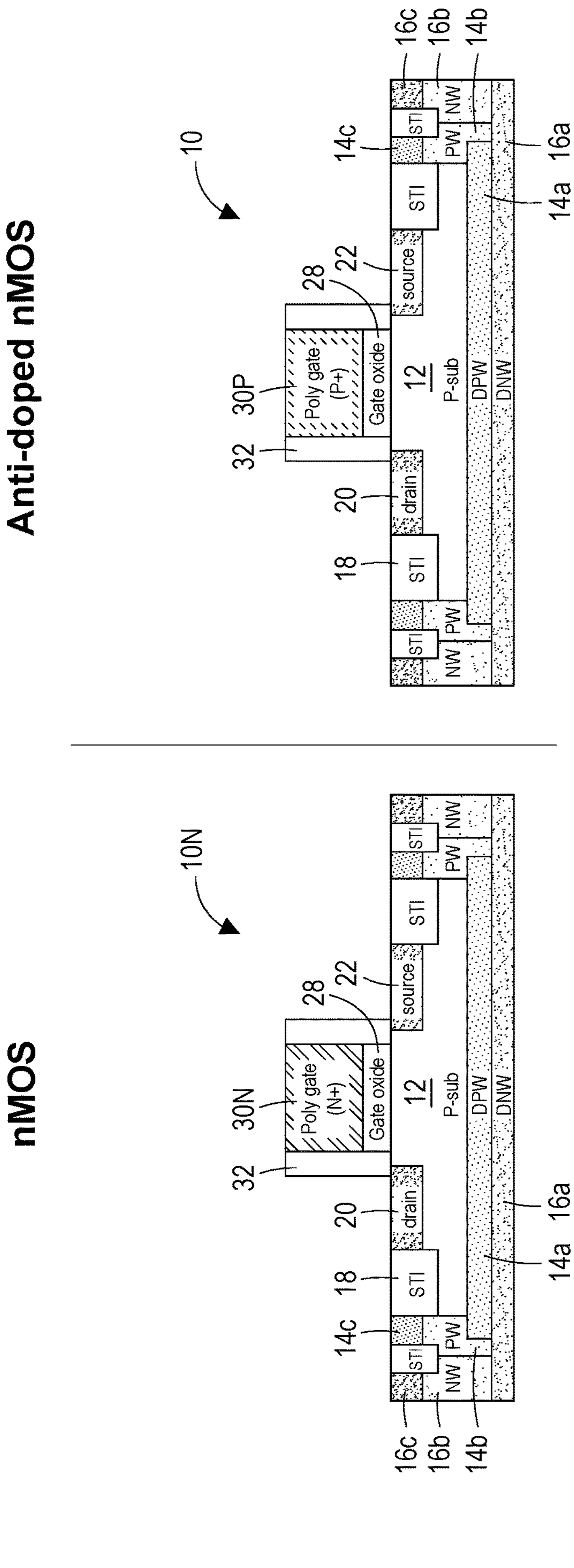
FIG. 2I illustrates sectional views of the final nMOS transistor (left side) and the final anti-doped nMOS transistor (right side).

With reference now to FIGS. 2A-2I, an illustrative method for fabricating the anti-doped nMOS device 10 of FIG. 1 is described and illustrated by way of diagrammatic sectional views at various stages of the fabrication. The fabrication process is advantageously very similar to the fabrication process for a conventional nMOS device, and differs in the openings in photomask steps in the later stages. In fact, the initial processing steps shown in FIGS. 2A-2F are identical for both the anti-doped nMOS device 10 and a conventional nMOS device, and hence are applicable to either device. The final processing steps shown in FIG. 2G-2I differ for the anti-doped nMOS device 10 and the nMOS device, and parallel fabrication steps are shown in FIGS. 2G-2I for an nMOS device (left side) and the anti-doped nMOS device 10 (right side). FIG. 2I shows the final devices, i.e. the nMOS device 10N (left side) and the anti-doped nMOS device 10 (right side).

Beginning with FIG. 2A, diagrammatically depicts a sectional view of the initial fabrication in which the starting base p-type material 12 has been processed to form the isolation regions 18, and after a dopant implantation step in which the n-well bottom portion 16*a* is formed as a deep n-well (DNW) 16*a* by n-type dopant implantation. The isolation regions may be formed in various ways typically used in CMOS fabrication processing technology, such as by shallow trench isolation (STI) or local oxidation of silicon (LOCOS). For the illustrative embodiment in which the p-type base material 12 is silicon, the dopant implantation to form the DNW 16*a* may suitably employ antimony (Sb), phosphorous (P), arsenic (As), $P_2$, or so forth. In some nonlimiting illustrative embodiments, the DNW 16*a* is doped at a concentration of about $10^{16}$-$10^{19}$ $cm^{-3}$, at a depth in a range of 2 micron to 10 micron and with a thickness of about 0.1 micron to about 1 micron.

FIG. 2B diagrammatically depicts a sectional view after a dopant implantation step in which the p-well bottom portion 14*a* is formed as a deep p-well (DPW) 14*a* by p-type dopant implantation. For the illustrative embodiment in which the p-type base material 12 is silicon, the dopant implantation may suitably employ boron (B), indium (In), or so forth. In some nonlimiting illustrative embodiments, the DPW 14*a* is doped at a concentration of about $10^{16}$-$10^{18}$ $cm^{-3}$, at a depth in a range of 2 micron to 10 micron (but shallower than the depth of the DNW 16*a*) and with a thickness of about 0.1 micron to about 2 micron. A patterned photoresist 40 is formed by photolithography (e.g., blanket photoresist layer deposition, optical exposure to form a latent image in the blanket photoresist layer followed by developing the latent image to form openings in the photoresist 40 in accord with the desired pattern) prior to the p-type dopant implantation to limit the lateral extent of the p-well bottom portion 14*a*.

FIG. 2C diagrammatically depicts a sectional view after a subsequent n-type dopant implantation step to form the sidewall n-well portion 16*b*. A patterned photoresist 42 is formed before the dopant implantation to limit the sidewall n-well portion 16*b* to the periphery of the n-well 16. (Although not explicitly stated going forward, in each subsequent step the previous patterned photoresist, e.g., here previous photoresist 40 shown in FIG. 2B, may be removed by a suitable photoresist stripping process before forming the next patterned photoresist, e.g., here the photoresist 42 shown in FIG. 2C). In some nonlimiting illustrative embodiments, the sidewall n-well portion 16*b* is doped at a concentration of about $10^{16}$-$10^{18}$ $cm^{-3}$, and with a depth sufficient to merge with the DNW 16*a*, to form the n-type well 16 providing isolation for the p-type base material 12 disposed in the n-type well 16. For the illustrative embodiment in which the p-type base material 12 is silicon, the dopant implantation to form the sidewall n-well portion 16*b* may suitably employ Sb, P, As, $P_2$, or so forth as the n-type dopant.

FIG. 2D diagrammatically depicts a sectional view after a subsequent p-type dopant implantation step to form the sidewall p-well portion 14*b*. A patterned photoresist 44 is formed before the dopant implantation to limit the sidewall p-well portion 14*b* to the periphery of the p-well 14 (and inside the sidewall n-well portion 16*b*, as seen in FIG. 2D). In some nonlimiting illustrative embodiments, the sidewall p-well portion 14*b* is doped at a concentration of about $10^{16}$-$10^{18}$ $cm^{-3}$, and with a depth sufficient to merge with the DPW 14*a*, to form the p-type well 14 contained within the n-type well 16 and providing further isolation for the p-type base material 12 disposed in the combined p-well 14 and n-type well 16. For the illustrative embodiment in which the p-type base material 12 is silicon, the dopant implantation to form the sidewall p-well portion 14*b* may suitably employ B, In, or so forth as the p-type dopant.

FIG. 2E diagrammatically depicts a sectional view after deposition of a gate oxide layer 28L and an undoped gate layer 30UL. The gate oxide layer 28L will be subsequently patterned to form the gate oxide 28. The undoped polysilicon gate layer 30UL will subsequently be patterned to form the gate, and doped either p-type to form the p-type gate 30P of the anti-doped nMOS device 10 (see FIG. 2H) or the n-type gate 30N of the native nMOS device 30N (see FIG. 2G). The gate oxide layer 28L may be formed, for example, using thermal oxidation of the surface of the p-type base material 12, or deposited by chemical vapor deposition (CVD), atomic layer CVD, or another deposition technique. The material of the gate oxide layer 28L may, for example, be $SiO_2$ or a high-k oxide such as $HfO_2$, $ZrO_2$, $HfZrO_2$, a mixed $HfO_2$+$SiO_2$, or so forth. The gate oxide layer 28L may suitably have a typical thickness for a MOSFET device, e.g. around 1 nm to 20 nm thick in some nonlimiting illustrative examples.

The gate layer 30UL may be polysilicon deposited, for example, by CVD. In some variant embodiments, the gate layer 30UL may be a metal material such as TiN or TaN deposited by CVD. The gate layer 30UL may have a thickness of 50 nm to 500 nm in some nonlimiting illustrative embodiments. The gate layer 30UL is typically not intentionally doped in its as-deposited state. A subsequent doping operation will be performed to from the p-type gate 30P of the anti-doped nMOS 10 (see FIG. 2H) or the n-type gate 30N of the native nMOS device 10N (see FIG. 2G).

FIG. 2F diagrammatically depicts a sectional view after a gate etch and spacer formation loop which etches the gate layer 30UL to form an undoped gate 30U and forms the spacers 32. These are suitably conventional nMOS fabrication steps. The structure shown in FIG. 2F is sometimes referred to herein as an nMOS device structure 10U, and includes the gate oxide 28 disposed on the p-type base material 12 and the undoped gate 30U disposed on the gate oxide 28. The undoped gate 30U can be subsequently doped n-type to form a native nMOS device 10N (see FIG. 2G), or can be anti-doped p-type to form the anti-doped nMOS device 10P (see FIG. 2H).

The fabrication steps diagrammatically depicted by a succession of sectional views in FIGS. 2A-2F are the same for fabrication of the native nMOS device 10N or the anti-doped nMOS device 10P. This is advantageous, because it means the utilizing the anti-doped nMOS device 10P in a (sub-) circuit of an IC such as a voltage reference (sub-) circuit does not require any modification of the native nMOS fabrication sequence up to the step shown in FIG. 2F.

For subsequent steps depicted in FIGS. 2G and 2H, there are differences between the processing for the anti-doped nMOS device 10P compared with the native nMOS device 10N. However, these steps can still be performed using the native nMOS fabrication workflow sequence, but merely require modification of the masks so that the appropriate doping is applied to the gate. These differences are shown in FIGS. 2G, 2H, and 2I by diagrammatically depicting the sectional views with a native nMOS fabrication on the left side (headed/titled "nMOS") and the anti-doped nMOS on the right (headed/titled "Anti-doped nMOS").

FIG. 2G diagrammatically depicts sectional views after of the native nMOS (left) and anti-doped nMOS (right) after a further n-type dopant implantation step, which forms the source and drain regions 20 and 22 and the n-well sidewall portion 16*c* of both the native nMOS and the anti-doped n-MOS, and also dopes the gate of the native nMOS n-type to form an n-type gate 30N of the native nMOS. Patterned photoresist 50 is applied before the n-type dopant diffusion to limit the doping to the aforementioned areas. Notably, a portion $\mathbf{50}_{GP}$ of the patterned photoresist 50 protects the undoped gate 30U of the anti-doped nMOS to avoid having this region doped n-type. Advantageously, the only modification of the nMOS fabrication process for the step diagrammatically depicted in FIG. 2G to obtain the anti-doped nMOS is to modify the photolithography mask for the anti-doped nMOS to include the additional photoresist portion $\mathbf{50}_{GP}$ protecting the undoped gate 30U of the anti-doped nMOS from receiving n-type dopant. In some nonlimiting illustrative embodiments, the n-type doping level applied by this n-type dopant implantation is in a range of $10^{18}$ to $10^{21}$ $cm^{-3}$, with the implantation being to a depth of 0.1 nm to 500 nm. This depth is chosen to obtain the desired complete doping of the entire n-type gate 30N and to obtain the desired thickness of the source and drain regions 20 and 22. It should be noted that while dopant implantation is illustrated, it is contemplated for this n-type doping step to be performed using dopant diffusion.

FIG. 2H diagrammatically depicts sectional views after of the native nMOS (left) and anti-doped nMOS (right) after a further p-type dopant implantation step, which forms the p-well sidewall portion 14*c* of both the native nMOS and the anti-doped n-MOS, and also dopes the gate of the anti-doped nMOS p-type to form the p-type gate 30P of the anti-doped nMOS. Patterned photoresist 52 is applied before the p-type dopant diffusion to limit the doping to the aforementioned areas. Notably, a portion $\mathbf{52}_{GP}$ of the patterned photoresist 52 protects the n-type gate 30N of the native nMOS to avoid having the p-type doping counter the n-type doping previously applied as shown in FIG. 2G; while, an opening $\mathbf{52}_{opening}$ allows the p-type dopant to dope the (previously undoped) gate of the anti-doped nMOS to form its p-type gate 30P. Advantageously, the only modification of the nMOS fabrication process for the step diagrammatically depicted in FIG. 2H to obtain the anti-doped nMOS is to modify the photolithography mask for the anti-doped nMOS to include the additional opening $\mathbf{52}_{opening}$ to enable p-type doping of the gate of the anti-doped nMOS device. In some nonlimiting illustrative embodiments, the p-type doping level applied by this p-type dopant implantation is in a range of $10^{18}$ to $10^{21}$ $cm^{-3}$ It should be noted that while dopant implantation is illustrated, it is contemplated for this p-type doping step to be performed using dopant diffusion.

FIG. 2I diagrammatically depicts sectional views of the final native nMOS device 10N (left) and the final anti-doped nMOS device 10 (right) after stripping of the patterned photoresist after completion of the p-type doping of FIG. 2H. It is seen that the native nMOS device 10N and the anti-doped nMOS device 10 are identical, except that the native nMOS device 10N has an n-type gate 30N while the anti-doped nMOS device 10 has a p-type gate 30P. This means that the anti-doped nMOS device 10 is intrinsically matched with the native nMOS device 10N. This intrinsic matching of the anti-doped nMOS device 10 and the native nMOS device 10N provides high temperature stability for the output reference voltage of a voltage reference circuit employing a pair of the native nMOS 10N and anti-doped nMOS 10, and suppresses substrate noise. In other contemplated embodiments, the native nMOS 10N and anti-doped nMOS 10 may have other differences, such as different device dimensions (e.g., different channel widths and/or lengths). These devices would still be intrinsically matched except for a straightforward compensation for the difference in device dimensions.

In the above example, the IC of which the voltage reference circuit is a part is fabricated in nMOS technology, in which the transistors of the IC are entirely (or at least predominantly) nMOS devices. In this illustrative case, the native nMOS 10N has p-type base (i.e., body) material 12, n-type source and drain regions 20 and 22, and an n-type gate 30N. In this case, the anti-doped nMOS 10 also has p-type base (i.e., body) material 12 and n-type source and drain regions 20 and 22, but has a p-type gate 30P, which is entirely doped p-type (with no n-type portions).

The skilled artisan can readily adapt the process to pMOS technology, that is, to an IC in which the transistors of the IC are entirely (or at least predominantly) pMOS devices. In this alternative case, the base (i.e., body) material is n-type (e.g., starting n-type silicon wafer, or starting SOI wafer with an n-type silicon layer), and the doping types of each of the steps diagrammatically shown in FIGS. 2A-2D, 2G, and 2H are reversed. That is, FIG. 2A would employ p-type dopant implantation to form a DPW, FIG. 2B would employ n-type dopant implantation to form a DNW, FIG. 2C would employ p-type doping, FIG. 2D would employ n-type doping, FIG. 2G would employ p-type doping, and FIG. 2H would employ n-type doping. The result would be the native pMOS having n-type base (i.e., body) material, p-type source and drain regions, and a p-type gate; while, the anti-doped pMOS would also have n-type base (i.e., body) material and p-type source and drain regions, but would have an n-type gate, which is entirely doped n-type (with no p-type portions).

Figure 3:
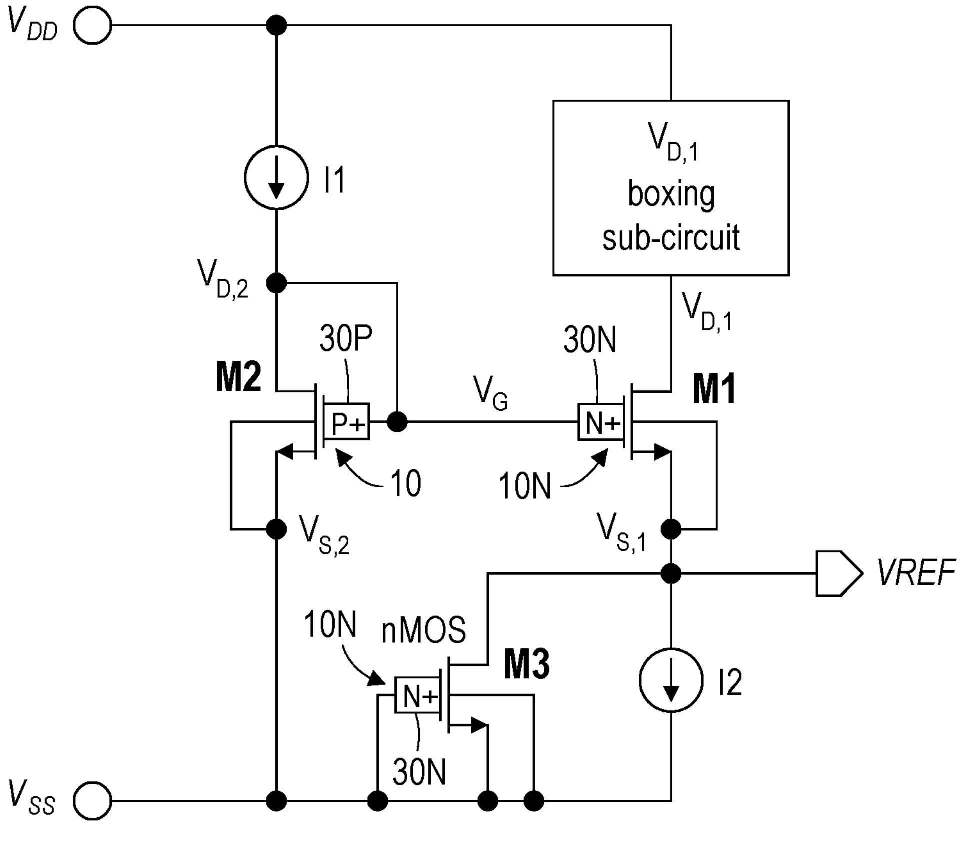
FIG. 3 shows a schematic diagram of a voltage reference circuit employing an nMOS transistor and an anti-doped nMOS transistor such as that of FIG. 1.

FIG. 3 presents a schematic diagram of a voltage reference for an nMOS technology IC, that includes a first transistor M1 which is a native nMOS device 10N (e.g., as shown in the left side of FIG. 2I) and a second transistor M2 which is an anti-doped nMOS device 10 (e.g., as shown in the right side of FIG. 2I, and also in FIG. 1). The IC (and the illustrative voltage reference sub-circuit of the IC) is powered by supply voltages $V_{DD}$ and $V_{SS}$ as is typical in an nMOS IC. In some cases, the supply voltage $V_{SS}$ may be electrical ground (i.e., $V_{SS}$=0 volts). A first current source I1 supplies a first current I1 to the anti-doped nMOS M2. A second current source I2 supplies a second current I2 to the native nMOS M1. A third nMOS M3 (which can be another native nMOS 10N) is connected between native nMOS M1 and $V_{SS}$. The current sources I1 and I2 can be implemented as native MOSFET based current sources using nMOS devices.

In the voltage reference circuit of FIG. 3, the gates of the first and second nMOS devices M1 and M2 are connected to form a common gate node of the voltage reference circuit. Thus, the n-type gate 30N of the native nMOS M1 and the p-type gate 30P of the anti-doped nMOS M2 are electrically connected so they have a common gate voltage. This common gate node has the common gate voltage designated $V_G$ in FIG. 3, which is the common voltage on both gates 30N and 30P of the nMOS devices M1 and M2. Furthermore, in the voltage reference circuit of FIG. 3, the drain region of the anti-doped nMOS device M2 is connected with the common gate node, and so also has the voltage $V_G$; that is, $V_{D,2}=V_G$, where $V_{D,2}$ denotes the drain voltage of the anti-doped nMOS device M2. The aforementioned electrical connections are suitably implemented, for example, as conductive traces and vias of one or more patterned metallization layers formed during back end-of-line (BEOL) processing of the IC.

Considering the native nMOS M1, it is seen that the common gate voltage $V_G$ can be written as:

$$V_G = VREF + V_{GS,1} \tag{1}$$

where $V_{GS,1}$ is the gate-to-source voltage of the native nMOS M1. Considering the anti-doped nMOS M2, it is seen that the common gate voltage $V_G$ can also be written as:

$$V_G = V_{SS} + V_{GS,2} \tag{2}$$

where $V_{GS,2}$ is the gate-to-source voltage of the anti-doped nMOS M2. Equating the right-hand expressions for the common gate voltage $V_G$ given in Equations (1) and (2) yields:

$$VREF + V_{GS,1} = V_{SS} + V_{GS,2} \tag{3}$$

which can be rearranged to give VREF as:

$$VREF = V_{SS} + (V_{GS,2} - V_{GS,1}) = V_{SS} + \Delta V_{GS} \tag{4}$$

where $\Delta V_{GS}=V_{GS,2}-V_{GS,1}$. If $V_{SS}$ is taken as circuit ground so that $V_{SS}=0$, then the output reference voltage VREF=$\Delta V_{GS}$. The p-type doping of the p-type gate 30P in the anti-doped nMOS M2 results in a different threshold voltage $V_{T,2}$ for the anti-doped nMOS M2 compared with the threshold voltage $V_{T,1}$ for the native nMOS M1, so that $\Delta V_{GS}$ is nonzero.

In the nonlimiting illustrative voltage reference circuit of FIG. 3, the first current source I1 supplies current to the anti-doped nMOS M2. Channel leakage from the native nMOS M1 flows to the third transistor M3. Using the anti-doped nMOS M2 further improves temperature independence of the output reference voltage VREF (along with the intrinsic matching of the native nMOS M1 and anti-doped nMOS M2). An optional native nMOS transistor-based $V_{D,1}$ boxing sub-circuit may be provided, for example to ensure that $V_{D,1}$ (the drain voltage of the native nMOS M1) is boxed at approximately twice VREF.

It will be appreciated that the illustrative voltage reference circuit of FIG. 3 is a nonlimiting illustrative example, and the disclosed combination of a native nMOS M1 and anti-doped nMOS M2 implemented as disclosed herein can be employed in various other reference voltage circuit designs, which typically comprise a circuit including the first nMOS device M1 and the second, anti-doped nMOS device M2, in which the voltage reference circuit further includes a node (e.g., node VREF in the example of FIG. 3) with operating voltage that is proportional to $\Delta V_{GS}$ where $\Delta V_{GS}$ is a difference between a gate-source voltage $V_{GS,1}$ of the first nMOS device and a gate-source voltage $V_{GS,2}$ of the second nMOS device.

Figure 4:
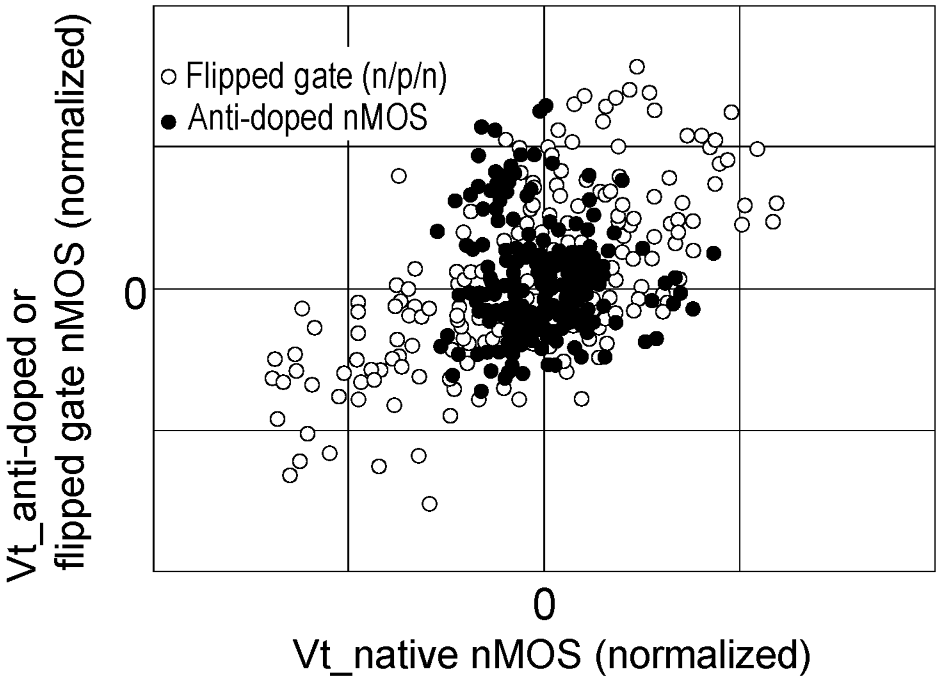
FIGS. 4 and 5 present experimental data as described herein.
Figure 5:
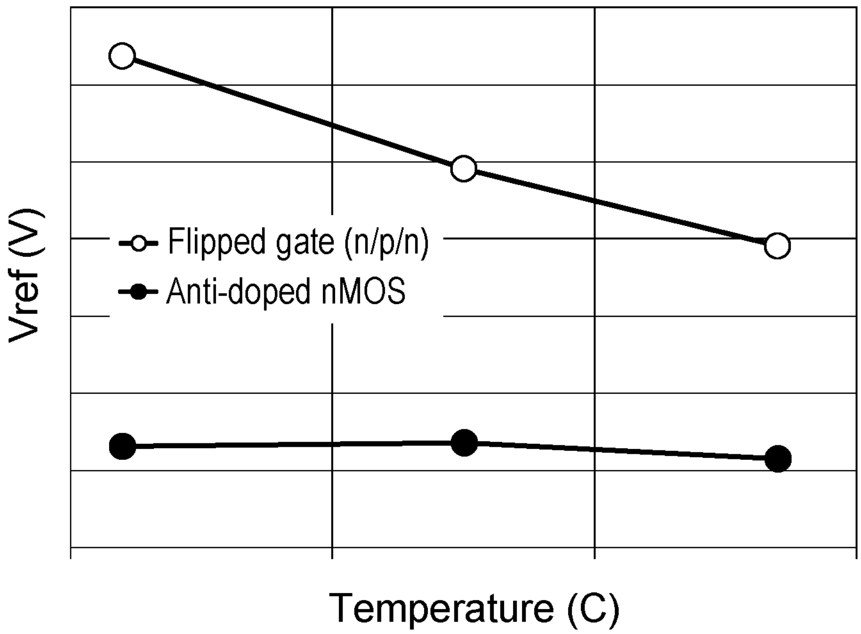

With reference to FIGS. 4 and 5, experimental data is presented for actually-fabricated flipped-gate nMOS devices having the gate doped in an n/p/n structure (called "Work function-based" in FIGS. 4 and 5) versus the anti-doped nMOS 10 of FIG. 1. FIG. 4 plots the threshold voltages for pairs of (native nMOS, flipped-gate nMOS) or (native nMOS, anti-doped nMOS), with the threshold voltage $V_t$ of the native nMOS plotted on the abscissa (X-axis) and the threshold voltage $V_t$ of the flipped-gate or anti-doped nMOS plotted on the ordinate (Y-axis). Improved intrinsic matching is observed for the anti-doped nMOS devices compared with the flipped-gate nMOS devices.

FIG. 5 plots temperature dependence of the output reference voltage VREF for the voltage reference circuit of FIG. 3 implemented using the anti-doped nMOS 10 as transistor M2 (as shown in FIG. 3), and implemented using the flipped-gate nMOS (with n/p/n gate doping) substituted for the transistor M2. Greatly improved temperature stability is observed. The temperature range plotted in FIG. 5 is about −40° C. to about +80° C. Over this range, VREF obtained using the flipped-gate nMOS varies by about 5 millivolts, whereas VREF obtained using the anti-doped nMOS (e.g., as shown in FIG. 1) varies by less than 1 millivolt, demonstrating excellent temperature stability for the voltage reference circuit using the anti-doped nMOS 10.

In the following, some further embodiments are described.

In a nonlimiting illustrative embodiment, a method of fabricating an electronic device is disclosed. The method comprises: forming a first nMOS device structure and a second nMOS device structure, each nMOS device structure including a gate oxide disposed on a p-type base material and a gate disposed on the gate oxide; performing n-type dopant implantation to form source and drain regions in the p-type substate of the first nMOS device structure and source and drain regions in the p-type substate of the second nMOS device structure and to further dope the gate of the first nMOS device structure n-type whereby a first nMOS device is formed comprising the first nMOS device structure with the gate doped n-type; and performing p-type dopant implantation to dope the gate of the second nMOS device structure p-type whereby a second nMOS device is formed comprising the second nMOS device structure with the gate anti-doped p-type.

In a nonlimiting illustrative embodiment, a method of fabricating an electronic device is disclosed. The method includes: forming a first nMOS device structure and a second nMOS device structure; performing an n-type doping step to dope a gate of the first nMOS device structure with an n-type dopant to form a first nMOS device having an n-type gate; and performing a p-type doping step to dope a gate of the second nMOS device structure with a p-type dopant to form a second nMOS device having a p-type gate that includes no n-type portion.

In a nonlimiting illustrative embodiment, an electronic device comprises: a first nMOS device comprising p-type material, a gate oxide disposed on the p-type material, and an n-type gate disposed on the gate oxide; and a second nMOS device comprising p-type material, a gate oxide disposed on the p-type material, and a p-type gate with no n-type portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an electronic device, the method comprising:

forming a first nMOS device structure and a second nMOS device structure, each nMOS device structure including a gate oxide disposed on a p-type base material and a gate disposed on the gate oxide;

performing n-type dopant implantation to form source and drain regions in the p-type base material of the first nMOS device structure and source and drain regions in the p-type base material of the second nMOS device structure and to further dope the gate of the first nMOS device structure n-type whereby a first nMOS device is formed comprising the first nMOS device structure with the gate doped n-type; and performing p-type dopant implantation to dope the gate of the second nMOS device structure p-type whereby a second nMOS device is formed comprising the second nMOS device structure with the gate anti-doped p-type;

wherein the first nMOS device and the second nMOS device are identical except that the gate of the first nMOS device is doped n-type and the gate of the second nMOS device is doped entirely p-type with no n-type portion.

2. The method of claim 1, further comprising:

prior to performing the n-type dopant implantation, disposing photoresist on the gate of the second nMOS device structure;

wherein the photoresist disposed on the gate of the second nMOS device structure prevents the n-type dopant implantation from doping the gate of the second nMOS device structure.

3. The method of claim 2, further comprising:

after performing the n-type dopant implantation, removing the photoresist on the gate of the second nMOS device structure and, prior to performing the p-type dopant implantation, disposing photoresist on the gate of the first nMOS device structure;

wherein the photoresist disposed on the gate of the first nMOS device structure prevents the p-type dopant implantation from doping the gate of the first nMOS device structure.

4. The method of claim 1, wherein the forming of each of the first nMOS device structure and the second nMOS device structure includes:

forming a well structure by dopant implantation in a p-type substrate, the well structure comprising a p-type well containing the p-type base material of the well structure and an n-type well containing the p-type well wherein the p-type well has higher p-type doping than the p-type base material;

forming the gate oxide on the p-type base material; and forming the gate on the gate oxide.

5. The method of claim 4, wherein the p-type dopant implantation increases a p-type doping level of a periphery of the p-type well of each of the first nMOS device structure and the second nMOS device structure.

6. The method of claim 1, wherein:

the gate of the first nMOS device structure is a polysilicon gate, and the gate of the second nMOS device structure is a polysilicon gate.

7. The method of claim 1, further comprising:

forming a voltage reference circuit including the first nMOS device and the second nMOS device.

8. A method of fabricating an electronic device, the method comprising:

forming a first nMOS device structure and a second nMOS device structure, each nMOS device structure including a gate oxide disposed on a p-type base material and a gate disposed on the gate oxide;

performing n-type dopant implantation to form source and drain regions in the p-type base material of the first nMOS device structure and source and drain regions in the p-type base material of the second nMOS device structure and to further dope the gate of the first nMOS device structure n-type whereby a first nMOS device is formed comprising the first nMOS device structure with the gate doped n-type;

performing p-type dopant implantation to dope the gate of the second nMOS device structure p-type whereby a second nMOS device is formed comprising the second nMOS device structure with the gate anti-doped p-type; and forming a voltage reference circuit including the first nMOS device and the second nMOS device, the forming of the voltage reference circuit including connecting the gates of the first and second nMOS devices to form a common gate node of the voltage reference circuit.

9. A method of fabricating an electronic device, the method comprising:

forming a first nMOS device structure and a second nMOS device structure using identical processing steps, wherein the second nMOS device structure is identical to the first nMOS device structure;

performing an n-type doping step to dope a gate of the first nMOS device structure with an n-type dopant to form a first nMOS device having an n-type gate; and performing a p-type doping step to dope a gate of the second nMOS device structure with a p-type dopant to form a second nMOS device having a p-type gate that includes no n-type portion.

10. The method of claim 9, wherein the n-type doping step also:

dopes p-type base material of the first nMOS device structure to form source and drain regions of the first nMOS device; and dopes p-type base material of the second nMOS device structure to form source and drain regions of the second nMOS device.

11. The method of claim 9, wherein:

the n-type doping step is an n-type dopant implantation step; and the p-type doping step is a p-type dopant implantation step.

12. The method of claim 9, further comprising:

forming a circuit including the first nMOS device and the second nMOS device, wherein the circuit includes a node with operating voltage that is equal to or proportional to $\Delta V_{GS}$ where $\Delta V_{GS}$ is a difference between a gate-source voltage $V_{GS,1}$ of the first nMOS device and a gate-source voltage $V_{GS,2}$ of the second nMOS device.

13. The method of claim 9, comprising:

disposing photoresist on a gate of the second nMOS device structure;

wherein the photoresist on the gate of the second nMOS device structure prevents the n-type doping step from doping the gate of the second nMOS device structure; and after the n-type doping step, removing the photoresist from the gate of the second nMOS device structure; and after removing the photoresist from the gate of the second nMOS device structure, performing the p-type doping step to dope the gate of the second nMOS device structure with the p-type dopant to form the second nMOS device having the p-type gate that includes no n-type portion.

14. The method of claim 13, further comprising:

prior to performing the p-type doping step, disposing photoresist on the gate of the first nMOS device structure, wherein the photoresist disposed on the gate of the first nMOS device structure prevents the p-type doping step from doping the gate of the first nMOS device structure.

15. The method of claim 13, wherein the n-type doping step also dopes p-type base material of the first nMOS device structure to form source and drain regions of the first nMOS device, and also dopes p-type base material of the second nMOS device structure to form source and drain regions of the second nMOS device.

16. The method of claim 13, further comprising:

forming a circuit including the first nMOS device and the second nMOS device, wherein the circuit includes a node with operating voltage that is equal to or proportional to $\Delta V_{GS}$ where $\Delta V_{GS}$ is a difference between a gate-source voltage $V_{GS,1}$ of the first nMOS device and a gate-source voltage $V_{GS,2}$ of the second nMOS device.

17. The method of claim 9, further comprising:

forming a voltage reference circuit including the first nMOS device and the second nMOS device.

18. The method of claim 17, wherein the forming of the voltage reference circuit includes:

connecting the gates of the first and second nMOS devices to form a common gate node of the voltage reference circuit.

19. The method of claim 9, wherein the forming of each of the first nMOS device structure and the second nMOS device structure includes:

forming a well structure by dopant implantation in a p-type substrate, the well structure comprising a p-type well containing a p-type base material of the well structure and an n-type well containing the p-type well wherein the p-type well has higher p-type doping than the p-type base material;

forming a gate oxide on the p-type base material; and forming the gate on the gate oxide.

20. The method of claim 19, wherein the p-type doping step increases a p-type doping level of a periphery of the p-type well of each of the first nMOS device structure and the second nMOS device structure.

* * * * *